(12) United States Patent
Trauth et al.

(10) Patent No.: US 9,836,073 B2
(45) Date of Patent: Dec. 5, 2017

(54) CURRENT SOURCE, AN INTEGRATED CIRCUIT AND A METHOD

(71) Applicants: Gerhard Trauth, Muret (FR); Emil Cozac, Balma (FR); Yean Ling Teo, Goyrans (FR)

(72) Inventors: Gerhard Trauth, Muret (FR); Emil Cozac, Balma (FR); Yean Ling Teo, Goyrans (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/582,269

(22) Filed: Dec. 24, 2014

(65) Prior Publication Data

US 2016/0026203 A1    Jan. 28, 2016

(30) Foreign Application Priority Data

Jul. 24, 2014    (WO) .................. PCT/IB2014/001602

(51) Int. Cl.
*G05F 3/02*    (2006.01)
*H03K 5/24*    (2006.01)
*H03F 1/02*    (2006.01)

(52) U.S. Cl.
CPC .............. *G05F 3/02* (2013.01); *H03F 1/0211* (2013.01); *H03K 5/2472* (2013.01); *H03K 5/2481* (2013.01); *H03F 2200/504* (2013.01)

(58) Field of Classification Search
CPC ........... G05F 3/02; G05F 5/00; H03K 5/2472; H03K 5/2481; H03F 1/02; H03F 1/0211; H03F 2200/504
See application file for complete search history.

(56) References Cited

U.S. PATENT DOCUMENTS

| | | |
|---|---|---|
| 6,922,319 B2 | 7/2005 | Akita |
| 7,786,805 B2 * | 8/2010 | Trauth ...................... H03F 1/02 330/285 |
| 2005/0017761 A1 | 1/2005 | Akita et al. |
| 2011/0210762 A1 | 9/2011 | Hirose et al. |

* cited by examiner

*Primary Examiner* — Jung Kim
(74) *Attorney, Agent, or Firm* — Charlene R. Jacobsen

(57) ABSTRACT

The present invention provides a current source comprising a first bias current control element, the first bias current control element being configured to generate a first current if the control value is lower than a reference value and configured to generate a second current if the control value equal to or higher than the reference value. In addition or alternatively the bias current source comprises a second bias current control element, the second bias current control element being configured to generate a third current if the control value is lower than or equal to the reference value and configured to generate a fourth current if the control value is higher than the reference value. Furthermore, the present invention provides an integrated circuit and a method.

19 Claims, 9 Drawing Sheets

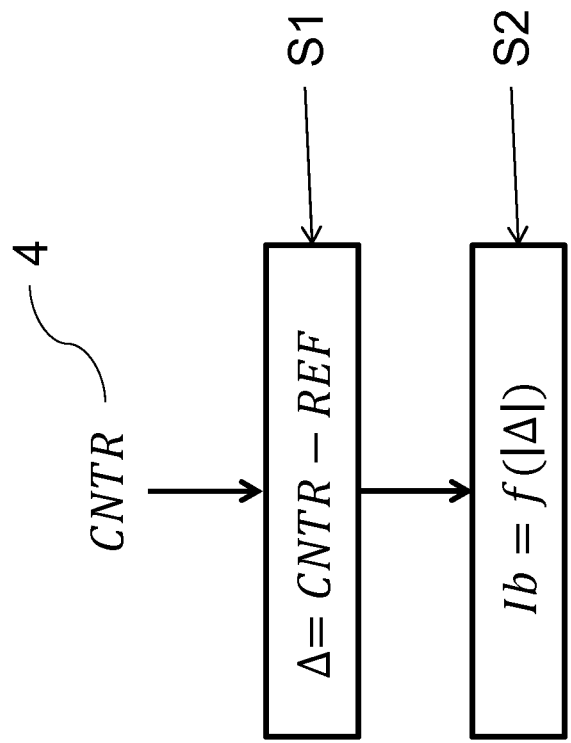
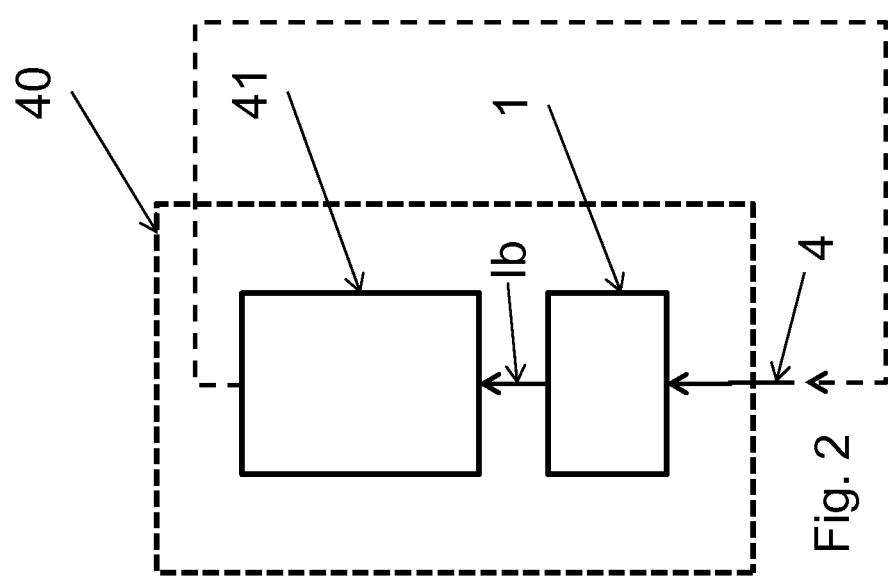

CURRENT SOURCE, AN INTEGRATED CIRCUIT AND A METHOD

CROSS REFERENCE TO RELATED APPLICATION(S)

The present application claims priority to International Patent Application No. PCT/IB2014/001602, entitled "A CURRENT SOURCE, AN INTEGRATED CIRCUIT AND A METHOD," filed on Jul. 24, 2014, the entirety of which is herein incorporated by reference.

DESCRIPTION

Field of the Invention

This invention relates to a bias current source, a threshold detector and an integrated circuit.

Background of the Invention

Bias current sources are needed in a variety of applications today. Bias current sources are especially needed in analog or mixed signal circuits or integrated circuits like processors, microcontrollers, comparators—for example the power on reset comparator on sensor chips, bus transceiver comparators, comparators in a flash ADC or the like. Bias current sources are used to provide a specific bias current to the analog or mixed signal circuits and to the circuit elements like transistors and diodes in the analog or mixed signal circuits. For example, it is important to provide a stable and sufficiently high bias current to the comparator so it will work properly in terms of speed and performance. However, the power consumption of the comparator is largely determined by the bias current.

To reduce the current consumption of a comparator United States patent application publication US 2005/0017761 A1 discloses a comparator with an additional leg with designed-in offset (switches ahead) which enable or provide additional bias current when the input voltage of the comparator is close to the tripping point. However, this solution can only be used at limited speed because the additional leg uses high-impedance nodes, which increase switching times. Such a slow increase in the bias current around the comparator tripping point will limit the utility of the circuit to applications where the comparator inputs have slow variations.

SUMMARY OF THE INVENTION

The present invention provides a bias current source, a threshold detector and an integrated circuit as described in the accompanying claims. Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIGS. are illustrated for simplicity and clarity and have not necessarily been drawn to scale.

FIG. 2 schematically shows a block diagram of an example of an integrated circuit.

FIG. 3 schematically shows a flow-chart of bias current control as can be performed by the example of FIG. 1.

DETAILED DESCRIPTION OF THE PREFERRED EMBODIMENTS

Because the examples described herein below are, for the most part, composed of electronic components and circuits known to those skilled in the art, circuit details will not be explained in any greater extent than that considered necessary for the understanding and appreciation of the underlying concepts of the present invention and in order not to obfuscate or distract from the teachings of the present invention.

Figure 1:
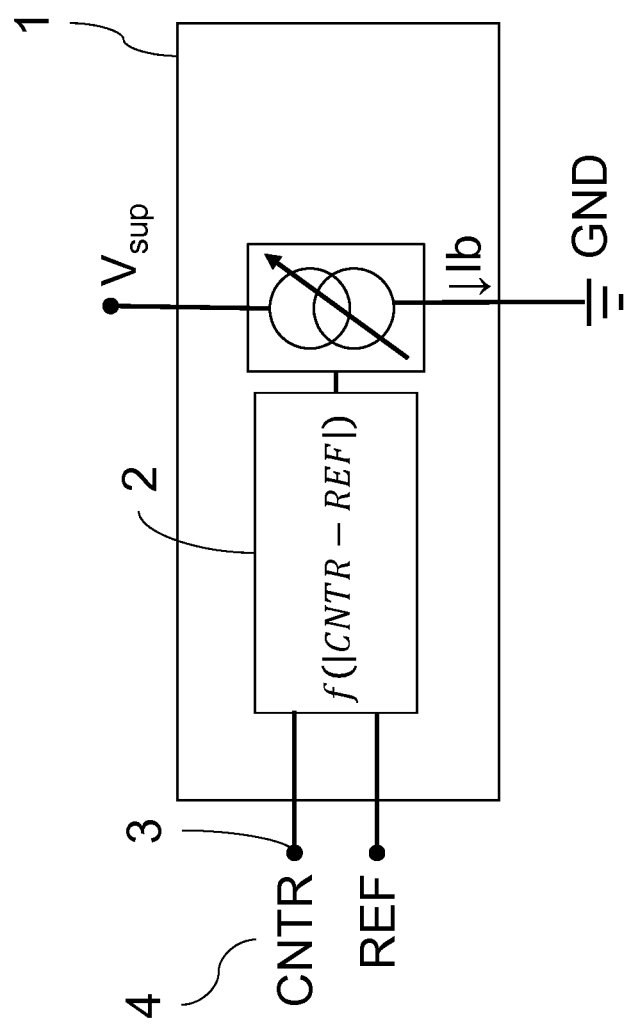
FIG. 1 schematically shows a block diagram of an example of a bias current source.

Referring to FIG. 1, as shown in the example therein, a bias current source 1 may comprise a bias current path between a high power supply node Vsup and a low power supply node (e.g., ground) GND. The bias current path allows to provide, when the bias current source is in operation, a bias current Ib which flows from the high power supply node to the low power supply node. As shown, the bias current source 1 may comprise a first control input 3 at which a control signal 4 may be received. The bias current source 1 comprises a bias current control circuit 2 connected to the first control input 3 and which is in the bias current path. The bias current control circuit controls, when the bias current source is in operation, the bias current as a function $f$ of the difference between a control value CNTR of a predetermined parameter of the control signal 4 (e.g., the voltage or current) and a reference value REF. The bias current decreases in at least one of ranges (a) or (b) when the absolute value of the difference increases, as explained in more detail with reference to FIGS. 5-9. Range (a) is the range in which the difference is positive and range (b) being the range in which the difference is negative.

It has been found by the inventors that less bias current is needed by e.g., a comparator to keep its state, when the voltages (or other quantities) which have to be compared are far apart from each other. Only when the reference value and the control value are almost the same a higher bias current is needed to quickly and precisely react to changes and switch the output state. Accordingly, the bias current source provides high current only when it is needed based on a control signal.

By suitably definition of the control value, also referred to herein as the threshold value, the currents generated by the bias current control element can be configured in detail. This allows providing higher currents in specific situations or based on specific input parameters when such higher currents are needed. For example in voltage or current comparators this allows supplying the required high bias current during comparison while minimizing the bias current when the input voltage or current is far away from the comparison region. This will reduce the overall quiescent current of the product. Thereby, the current consumption in integrated circuits can be reduced when no high bias current is needed and at the same time allows providing higher bias currents, e.g., to allow fast switching processes e.g., in comparator circuits, when the control signal indicates a need for such higher currents. Therefore, this allows reduced power consumption without deterioration of the performance of the integrated circuit.

As shown in FIG. 1, the bias current source may comprise a second control input for receiving the reference value REF, e.g., in the form of a reference or threshold current or voltage. For instance, the control signal 4 may provide a control voltage or current, and a reference voltage or current may be provided to the bias current control element. The bias current control circuit may then control, when the bias current source is in operation, the bias current as a function of the difference between the control voltage or current and the reference voltage or current, such that the bias current decreases when the absolute value of said difference increases.

FIG. 2 schematically shows an example of an integrated circuit 40. The integrated circuit 40 comprises an analog or mixed signal circuit 41 which is coupled with a bias current source 1.

The bias current source 1 is connected to a bias input of the circuit 41, and provide when the current source is in operation the analog or mixed signal circuit 41 with a bias current Ib. This bias current Ib can be adapted to provide a higher current value in certain circumstances which in an embodiment can be controlled by the analog or mixed signal circuit 41 by adapting the control signal 4 which is provided to the bias current source 1, as indicated in this FIG. 2 with the dashed line. For example, the control signal 4 can be actively generated by the analog or mixed signal circuit 41 in an embodiment. In another embodiment, the control signal 4 is an input signal to the analog or mixed signal circuit 41 or is based on an input signal of the analog or mixed signal circuit 41, and the control signal 4 can e.g., be passively generated.

The analog or mixed signal circuit 41 can be any suitable type of circuit 41. In an embodiment the analog or mixed signal circuit 41 is a comparator used in a power-on reset circuit of a microcontroller, microprocessor, or the like where the threshold detector 41 compares a supply voltage Vcmp of the microcontroller to a specific reference voltage Vref. In such an embodiment, as long as the two voltages Vcmp and Vref are far apart from each other there is no need for the threshold detector 41 to provide a fast response to changes in the Vcmp voltage, it only should keep its state. Only when the supply voltage Vcmp approximates the reference voltage Vref the threshold detector 41 should be biased with a higher current in order to provide a correct comparison signal.

Therefore, the bias current source 1 in such an example can be adapted to only provide a higher current Ib to the comparator when the supply voltage Vcmp approximates the reference voltage Vref as will be explained in greater detail below.

FIG. 3 schematically shows a flowchart which illustrates the operation of the bias current control element 1. As shown with block S1, the bias current control element 1 receives a control value CNTR (e.g., provided in the form of a voltage or current of the control signal 4), and as shown with block S2 controls the bias current Ib as a function of the difference $\Delta$ between the control value and a reference value REF. 1. The bias current is decreased when the absolute value of the difference $\Delta$ increases in the range in which the difference is positive (i.e., $\Delta>0$) and/or the range in which the difference is negative (i.e., $\Delta<0$).

The bias current may be increased and decreased as a function of the difference, $\Delta$, in any suitable manner. As shown in the graph at the right hand side of FIG. 5 for example, when the bias current source is in operation, the bias current Ib may be monotonically decreased when the absolute value of the difference increases and the difference is negative and be constant above a predetermined saturation value when the difference, $\Delta$, is positive. Alternatively, as shown in the graph at the right hand side of FIG. 6 for example, when the bias current source is in operation, the bias current Ib may be monotonically decreased when the absolute value of the difference increases and the difference is positive and be constant below a predetermined saturation value when the difference, $\Delta$, is negative. The predetermined saturation value may have any suitable value and for example be where the difference, $\Delta$, is, for practicable purposes, negligible such as zero or at any other value suitable for the specific implementation.

Figure 9:
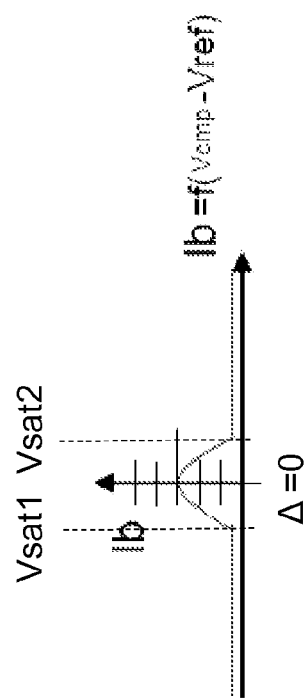

Alternatively, as shown in FIG. 9, both when the difference, $\Delta$, is negative and positive, the bias current may be constant when the absolute value exceeds a respective predetermined saturation value Vsat1,Vsat2. It should be noted that the predetermined saturation value Vsat1,Vsat2 may have the same magnitude (e.g., the function is mirror symmetric along the line through the point where the difference, $\Delta$, is zero) or be different. The bias current Ib may be monotonically decreased when the absolute value of the difference, $\Delta$, is between the saturation value and zero, and the bias current may have a maximum when the difference, $\Delta$, is negligible.

In the range where the bias current source is constant, the bias current may be larger than zero. Thereby it can be ensured that the circuit biased by the bias current retains its state.

The bias current control circuit may be implemented in any manner suitable for the specific implementation. As shown in FIGS. 4-7, the bias current control circuit may comprise at least one of: a first bias current control element 23 and a second bias current control element 31 in the bias current path, each of the bias current control elements 23,31 having a variable impedance. The first bias current control element 23 presents a first variable impedance in the bias current path. The second bias current control element 31 presents a second variable impedance in the bias current path.

As shown in FIGS. 4-7, and explained below in more detail, the bias current control circuit 2 may comprise one or more suitable impedance control circuits 5,6 connected to the respective bias current control element 23,31. A first impedance control circuit 5 varies the first variable impedance, when the bias current source is in operation, as a monotonic increasing function of the control value if the difference is smaller than zero. A second impedance control circuit 6 varies the second variable impedance, when the bias current source is in operation, as a monotonic increasing function of the control value if the difference is larger than zero. For example, the first bias current control element 23 and the second bias current control element 31 may each comprise a controllable device, such as a transistor for example a MOS such as a pMOS or nMOS, comprising a first current terminal and a second current terminal, and a control terminal for controlling current flowing between the first current terminal. The first impedance control circuit may be connected to the control terminal of the controllable device of the first bias current control element and the second impedance control circuit may then be connected to the control terminal of the controllable device of the second bias current control element.

Figure 4:
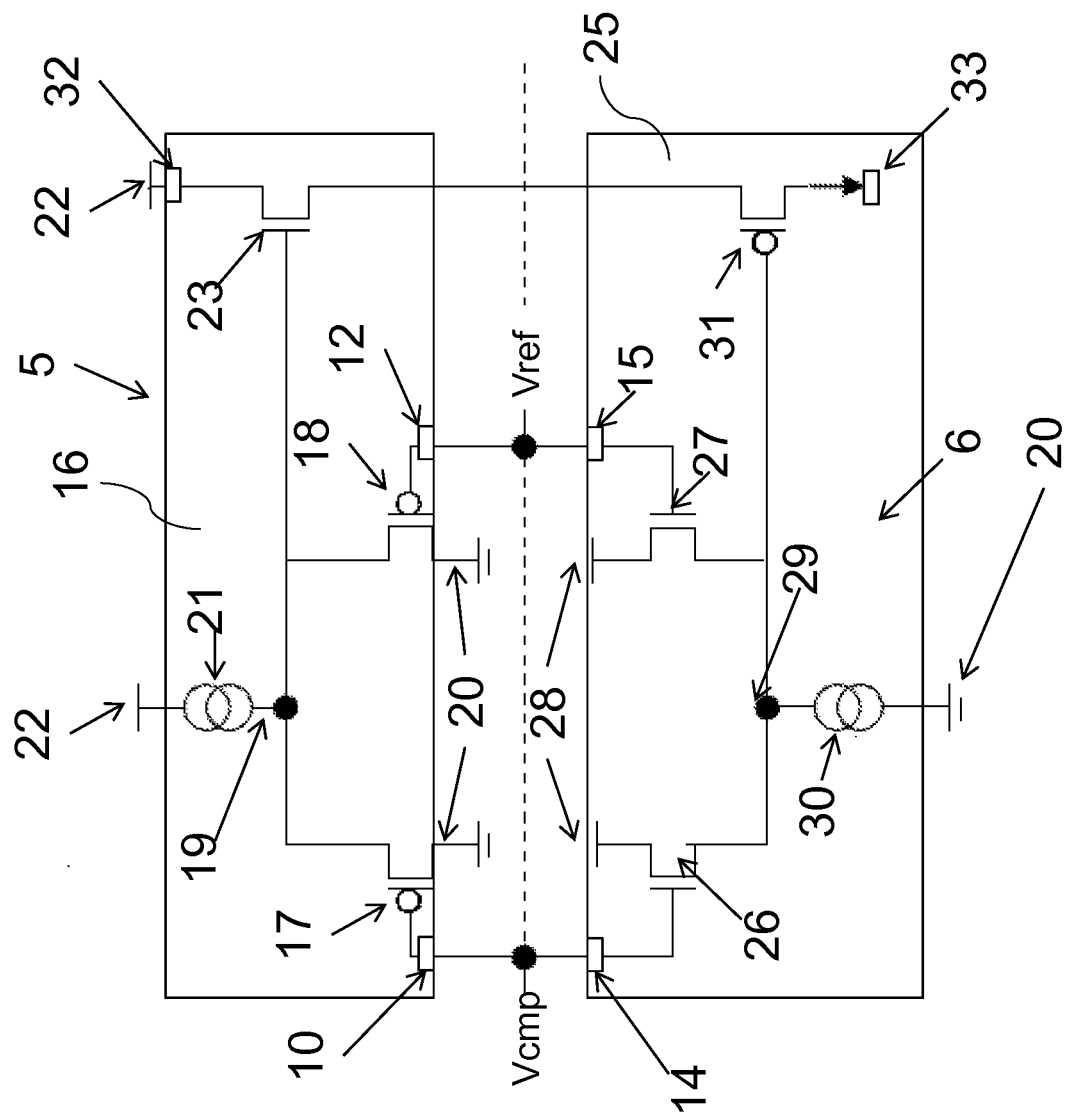
FIG. 4 schematically shows a circuit diagram of a first example of a bias current source.

The example of FIG. 4 comprises both a first bias current control element 23 and a second bias current control element 31 connected in series in the bias current path. The bias current control elements 23, 31 exhibit opposite behavior, and in this examples are transistors of opposite conductivity types (that is p-type versus n-type), more specifically bias current control element 23 is an nMOS transistor and bias current control element 31 is a pMOS transistor. Thus, the bias current control element 23 opens when the difference becomes less negative and saturates when the difference is positive above the saturation threshold, whereas the bias current control element 31 opens when the difference becomes less positive and saturates when the difference is negative below the saturation threshold.

Figure 8:
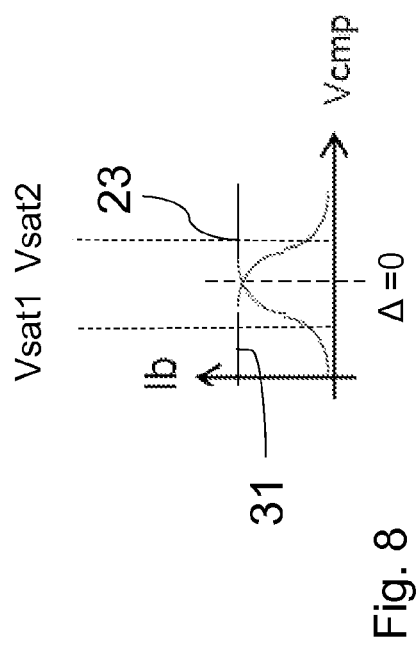
FIGS. 8 and 9 schematically shows graphs of bias currents illustrating the operation of the examples of FIGS. 4 and 7.

As illustrated in the graph of FIG. 8, each of the bias current control elements 23,31 exhibits a conductivity as a function of the difference, Δ, and accordingly allows a bias current in the bias current path as indicated. In FIG. 8, the respective current allowed has been combined in a single diagram such that the intersection point of the two graphs lies where Vcmp equals Vref and the difference, Δ, is zero. As illustrated in FIG. 9, by connecting the first bias current control element 23 and the second bias current control element 31 electrically in series, the bias current has to flow through both the first bias current control element 21 and the second bias current control element 31. Thus, the resultant bias current is the lowest of the currents shown in FIG. 8. FIG. 9 schematically shows the resulting current, which is the respective lowest current of the two graphs shown in FIG. 8.

The graph of the current in FIG. 9 comprises a maximum current when Vref=Vcmp and on both sides of the maximum the current drops down to a minimum current, which in an embodiment can be 0 μA. However, depending on the specific implementation, the voltages Vref and Vcmp may be scaled, for example with a voltage divider, with a respective scaling factors X1 and X2. In such an embodiment, the difference, Δ, could be (Vref*X1)–(Vcmp*X2), and hence difference Δ be zero when Vref*X1=Vcmp*X2. For example, if a voltage divider is used to divide the control voltage Vcmp by 2, the bias current source 1 would provide a maximum current when the difference diff=Vref–(Vcmp/2)=0. Other divider values are also possible. Furthermore, in this example when Vcmp equals Vref the difference Δ is zero for both bias current control elements 23, 31. However, it would be apparent that for one of the current control elements 23, 31 this may be shifted relative to the other current control element.

Referring back to FIG. 4, as shown, the first impedance control circuit 5 may comprise a voltage follower, in this example an nMOS follower 16, and the second impedance control circuit 6 is a voltage follower, in this example a pMOS voltage follower 25, which control a respective bias current control element 23,31.

In the shown example, the nMOS based voltage follower 16 comprises a first control input 10 and a first transistor 17. A control input of the first transistor 17 is connected to the first control input 10. Furthermore, the nMOS based voltage follower 16 comprises a second control input 12 and a second transistor 18. A control input of the second transistor 18 is connected to the second control input 12. The first transistor 17 and the second transistor 18 are connected in parallel between a first node 19, and a ground node 20, and the current flowing between the nodes 19,20 through the transistors is controlled via the respective control input 10,12, in this example by the voltage at that input. The bias current source 1 in FIG. 4 furthermore comprises a first current source 21 connected between a positive supply node 22 and the first node 19, which in this example provides a constant current to the first node 19, and accordingly allows via the transistors 17,18 vary the voltage thereof as function of the difference between Vcmp and Vref. In an embodiment, the first transistor 17 and the second transistor 18 each include a transistor of a conductivity type opposite to that of the first bias current control element 23, thus in this example a pMOS transistor. As shown, a control input of the bias current control element, in this example the nMOS transistor 23, is connected to the first node 19, whereas a first current terminal of the nMOS transistor 23 is connected to a positive supply node 22 and a second current terminal of the nMOS transistor 23 is connected to a first current terminal of the second bias current control element 31. The current flowing through the nMOS transistor is controlled by the voltage applied at the control input thereof.

In the example shown in FIG. 4, the pMOS based voltage follower 25 comprises a third control input 14 and a third transistor 26. A control input of the third transistor 26 is connected to the third control input 14. Furthermore, the pMOS based voltage follower 25 comprises a fourth control input 15 and a fourth transistor 27 of which a control input is connected to the fourth control input 15. The third transistor 26 and fourth transistor 27 are connected in parallel with their current terminals between a positive supply node 28, and a fourth node 29, and the current flowing through those transistors between nodes 28,29 is controlled by via the respective control input, in this example by the voltage at that input. A second current source 30 is connected between the fourth node 29 and a ground node 20, which in this example provides a constant current to the node 29, and accordingly allows via the transistors 26,27 to vary the voltage thereof as function of the difference between Vcmp and Vref. In an embodiment, the third transistor 26 and the fourth transistor 27 each comprise a transistor of a conductivity type opposite to that of the first and second transistor in the voltage follower 15, thus in this example a nMOS transistor. A control input of the pMOS transistor 31 is connected to the fourth node 29, a second current terminal of the pMOS transistor 31 is connected to the second current terminal of the nMOS transistor 23, as already explained above, and a first current terminal of the pMOS transistor 31 is connected to the ground node 20. The current flowing through the pMOS transistor is controlled by the voltage applied at the control input thereof.

The first control input 10 and the third control input 14 are both connected to the control voltage Vcmp and the second control input 12 and the fourth control input 15 are both connected to the reference voltage Vref. A load which is directly biased by the bias current source 1 or circuitry connecting the bias current source to such a load, e.g., a diode of a current mirror, can for example be positioned between the positive supply node 22 and the power input of the nMOS transistor 23 at a power input 32 of the bias current source 1. Such a load can also be positioned between the power input of the pMOS transistor 31 and the ground node 20 at the power output 33 of the bias current source 1.

Figure 5:
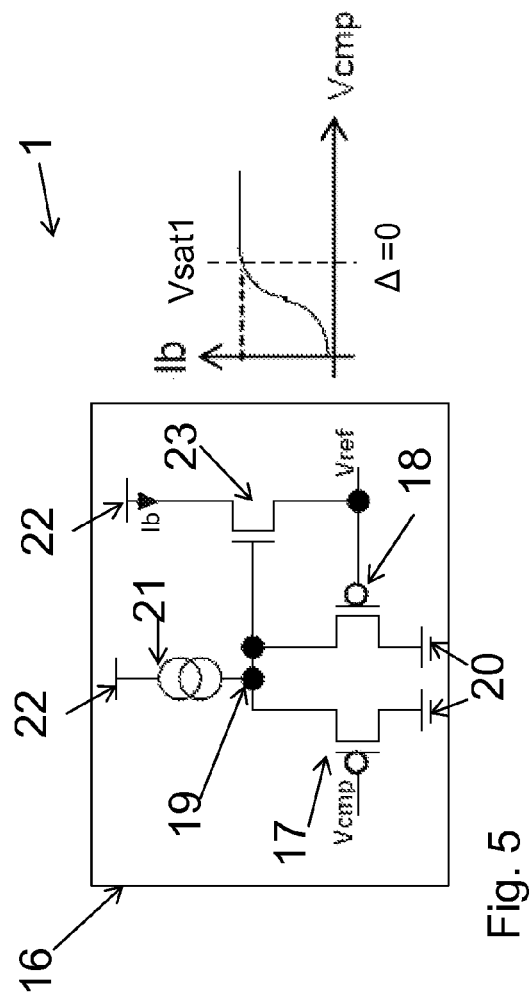
FIG. 5 schematically shows a circuit diagram of a second example of a bias current source.
Figure 6:
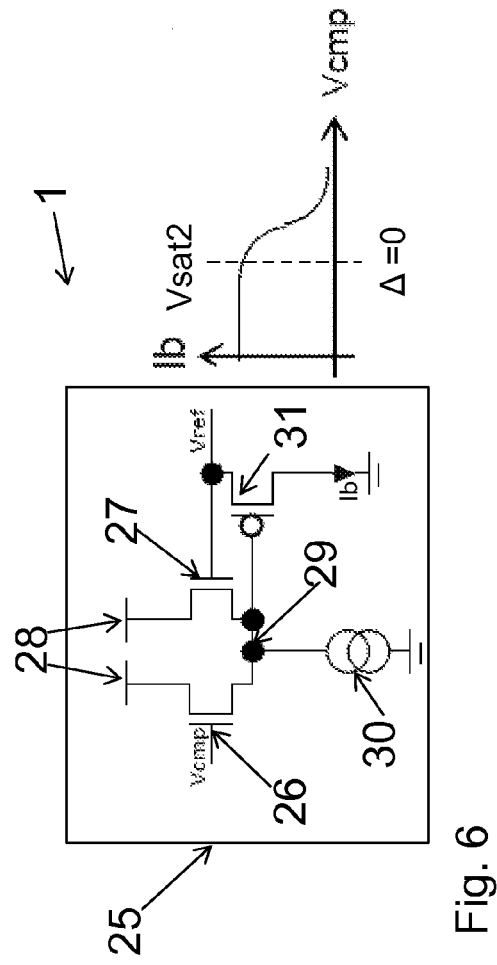
FIG. 6 schematically shows a circuit diagram of a third example of a bias current source.

As shown in the left hand parts of FIGS. 5 and 6, the bias current source 1 may comprise only the first bias current control element 23 or the second bias current control element 31. This allows providing a bias current which monotonically decreases when the absolute value of the difference increases either when negative and constant as a function of the difference when said absolute value exceeds a predetermined saturation value when positive, or vice versa.

The bias current source 1 of FIG. 5 comprises only the first bias current control element 23 and an associated voltage follower 16. The voltage follower 16 comprises the same components as the voltage follower 16 of FIG. 4, and is therefore not described in further detail. In FIG. 5 the left-hand side shows the circuit diagram of the bias current source 1 and the left-hand side a graph showing the current output lb of the bias current source 1 of FIG. 5, in relation to the difference between a control voltage Vcmp on the control input of the first transistor 17 and a reference voltage Vref on the control input of the second transistor 18.

As can be seen from the graph, when the control voltage Vcmp is smaller than the reference voltage Vref (and the difference, Δ, is negative), the bias current provided by the bias current source 1 monotonically decreases when the difference, Δ, becomes more negative. If the control voltage Vcmp is greater than the reference voltage Vref (and the difference, Δ, is positive), the current provided by the bias current source 1 reaches a saturation level and is approximately constant.

The bias current may have any suitable value and for example start at 0 μA if the control voltage Vcmp is far smaller than the reference voltage Vref (and the difference, Δ, is very negative). In another embodiment, the components of the bias current source 1 can be adapted such that the bias current lb starts at a predetermined minimum current above 0 μA if the control voltage Vcmp is far smaller than the reference voltage Vref (e.g., by not fully switching off the transistor). This minimum current can for example be a current which is sufficient for a comparator to retain its state. As shown, the bias current starts increasing monotonically as a function of the difference, Δ, only close to the point where Δ=0, and reaches a maximum at Δ=0 while remaining constant, at the maximum, when Δ>0.

In FIG. 5, no specific values have been presented for the current in the diagram because the bias current source 1 can be adapted to provide different currents depending on the respective application. However, in an example the smallest value of the first bias current lb is 0 μA and the maximum value 5 μA.

FIG. 6 schematically shows an example of a bias current source 1. The bias current source 1 of FIG. 6 comprises the second bias current control element 31 and an associated voltage follower 25. The voltage follower 25 comprises the same components as the voltage follower 16 of FIG. 4, and is therefore not described in further detail. 6 embodied as a pMOS based voltage follower 25.

In FIG. 6 the left hand side shows the circuit diagram of the bias current source 1 and the right hand side a graph showing the current output lb of the bias current source 1 of FIG. 6 in relation to the difference between the control voltage Vcmp on the control input of the third transistor 26 and a reference voltage Vref on the control input of the second fourth transistor 27.

As can be seen from the graph, when the control voltage Vcmp is smaller than the reference voltage Vref (and the difference, Δ, is negative), the current provided by the bias current source 1 is at its maximum, at a saturation level and approximately constant. When the control voltage Vcmp is larger than the reference voltage Vref (and the difference, Δ, is positive), the bias current provided by the bias current source 1, monotonically decreases when the difference, Δ, increases to a minimum, such as 0 μA. This minimum current can for example be a current which is sufficient for a comparator to retain its state. As shown, the bias current decreases rapidly monotonically as a function of the difference, Δ, close to the point where Δ=0, and reaches a minimum when Δ is positive and far larger than 0.

In FIG. 6, no specific values have been presented for the bias current in the diagram because the bias current source 1 can be adapted to provide different bias currents depending on the respective application. In an embodiment the maximum value of the bias current is 5 μA and the minimum value 0 μA.

Figure 7:
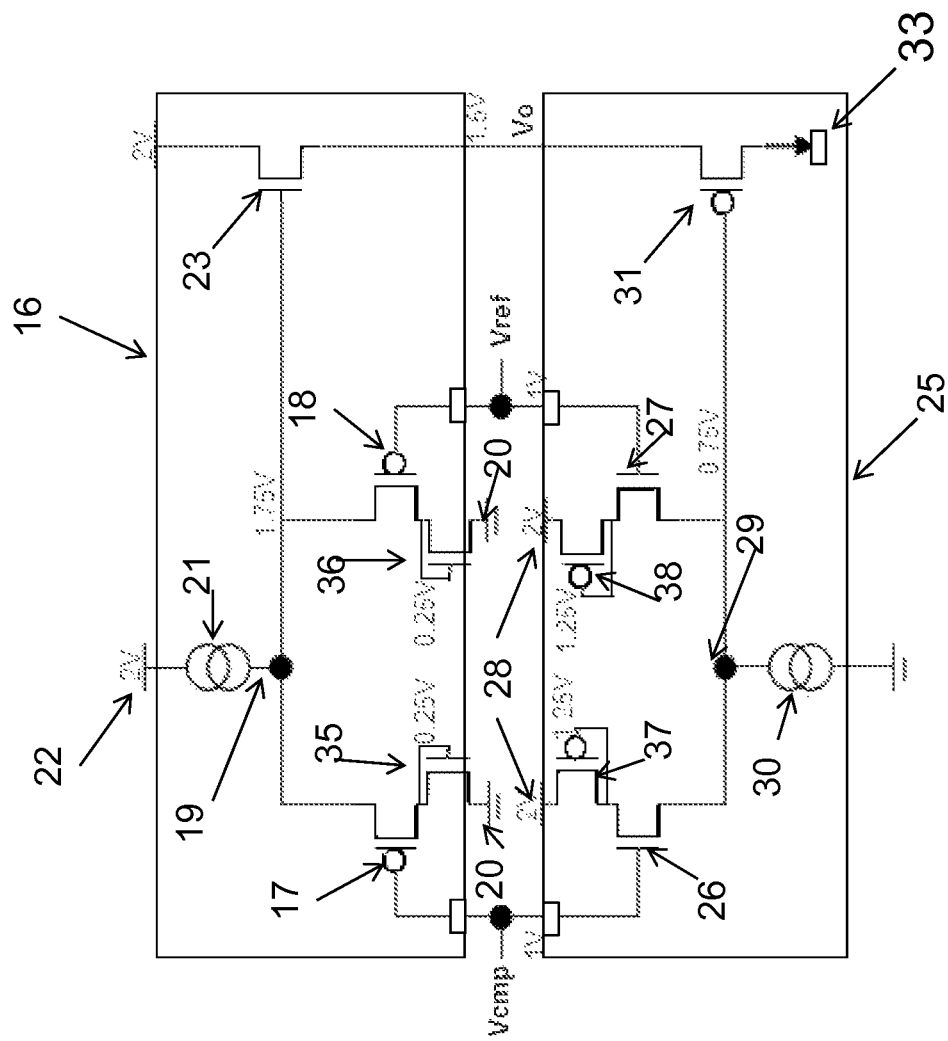
FIG. 7 schematically shows a circuit diagram of a fourth example of a bias current source.

FIG. 7 schematically shows an example of a bias current source 1. The bias current source 1 of FIG. 7 is based on the bias current source 1 of FIG. 4 and comprises in addition thereto in the voltage follower 16 circuit a fifth transistor 35, especially an nMOS transistor 35. A first current terminal of the fifth transistor 35 and a control input of the fifth transistor 35 are connected to the second current terminal of the first transistor 17 and a second current terminal of the fifth transistor 35 is connected to the ground node 20. Furthermore, the bias current source 1 comprises a sixth transistor 36, especially an nMOS transistor 36. A first current terminal of the sixth transistor 36 and a control input of the sixth transistor 36 are connected to the second current terminal of the second transistor 18 and a second current terminal of the sixth transistor 36 is connected to the ground node 20.

The pMOS based voltage follower 25 further comprises in the voltage follower 25 a seventh transistor 37, especially a pMOS transistor 37. A second current terminal of the seventh transistor 37 is connected to the positive supply node 28, and a first current terminal of the seventh transistor 37 and a control input of the seventh transistor 37 are connected to the first current terminal of the third transistor 26. The pMOS based voltage follower 25 comprises an eighth transistor 38, especially a pMOS transistor 38. A second current terminal of the eighth transistor 38 is connected to the positive supply node 28 and a first current terminal of the eighth transistor 38 and a control input of the eighth transistor 38 is connected to the first current terminal of the fourth transistor 27.

In FIG. 7, voltage values are provided at some components of the bias current source 1. The voltages in FIG. 7 can be calculated based on the following equations and show that the modifications in FIG. 7 decrease the dependency of the bias current source 1 on variations due to production processes variations, supply voltage variations and temperature variations.

The following voltage analysis is based on Vref=Vcmp and the following assumptions and notations:

$$V_{GSN} = V_{GSN}1 = V_{GSN}2 = V_{GSN}3 = V_{GSN}4 \tag{1}$$

$$V_{GSP} = V_{GSP}1 = V_{GSP}2 = V_{GSP}3 \tag{2}$$

In which $V_{GSN}1$ is the gate source voltage of the third transistor 26, $V_{GSN}2$ is the gate source voltage of the fourth transistor 27, $V_{GSN}3$ is the gate source voltage of the nMOS transistor 23, and $V_{GSN}4$ is the gate source voltage of the sixth transistor 36. Furthermore, $V_{GSP}1$ is the gate source voltage of the first transistor 17, $V_{GSP}2$ is the gate source voltage of the second transistor 18, and $V_{GSP}3$ is the gate source voltage of the pMOS transistor 31

For the bias current source of FIG. 7, the voltage Vo—the voltage at a node between the power output of the nMOS transistor 23 and the power input of the pMOS transistor 31—can be written as:

$$Vo = Vref + V_{GSP}1 - V_{GSN}3 = Vref + V_{GSP} - V_{GSN} \quad (3)$$

The drain-source voltage for the first transistor 17, the second transistor 18 and the nMOS transistor 23 can be written as:

$$-V_{DSP}1 = Vref + V_{GSP} \quad (4)$$

$$-V_{DSP}3 = Vo \quad (5)$$

By replacing Vo in (5) with the expression (3):

$$-V_{DSP}3 = Vref + V_{GSP} - V_{GSN} \quad (6)$$

Taking into account (4) and (6), it is apparent that the bias current source according to FIG. 4 can have different source-drain voltages for the pMOS transistors ($V_{DSP}3 \mathrel{!=} V_{DSP}1$):

$$-V_{DSP}1 + V_{DSP}3 = Vref + V_{GSP} - Vref - V_{GSP} + V_{GSN} \quad (7)$$

$$-V_{DSP}1 + V_{DSP}3 = V_{GSN} \quad (8)$$

A similar relation can be written for $V_{DSN}1 - V_{DSN}3$, in which $V_{DSN}1$ is the drain-source voltage for nMOS transistor 26 and $V_{DSN}3$ is the drain-source voltage for nMOS transistor 23.

$$V_{DSN}1 = V_{DD} - Vref + V_{GSN} \quad (9)$$

$$V_{DSN}3 = V_{DD} - Vo \quad (10)$$

Replacing Vo with (3):

$$V_{DSN}3 = V_{DD} - Vref - V_{GSP} + V_{GSN} \quad (11)$$

$$V_{DSN}1 - V_{DSN}3 = V_{DD} - Vref + V_{GSN} - V_{DD} + Vref + V_{GSP} - V_{GSN} \quad (12)$$

$$V_{DSN}1 - V_{DSN}3 = V_{GSP} \quad (13)$$

This shows that the bias current source 1 of FIG. 4 can have different source-drain voltages for the nMOS transistors, or formulated mathematically $V_{DSN}3$ is not necessarily the same as $V_{DSN}1$.

Equation (8) suggests that equal drain-source voltages for pMOS transistors 17, 18 and 31 (for Vcmp=Vref) can be obtained by lowering the drain-source voltage of the first and second transistors 17, 18 with an amount equal to $V_{GSN}$, which can be done by inserting in series with each of those devices diode-connected nMOS transistors, fifth transistor 35 and sixth transistor 36.

Equation (13) suggests that equal drain-source voltages for nMOS transistors 26, 27 and 23 (for Vcmp=Vref) can be obtained by lowering the drain-source voltage of the third transistor 26 and the fourth transistor 27 with an amount equal to $V_{GSP}$, which can be easily done by inserting in series with each of those devices diode-connected pMOS transistors, seventh transistor 37 and eight transistor 38.

Accordingly, the modifications of example of FIG. 7 relative to the example of FIG. 4 allow providing a bias current source 1 with reduced sensitivity to production process variations, supply voltage variations, and temperature variations. As previously discussed, diode-connected pMOS devices, seventh transistor 37 and eight transistor 38, and diode-connected nMOS transistors, fifth transistor 35, and sixth transistor 36, were added to the bias current source of FIG. 4.

Assuming $V_{GSP}=0.75V$ and $V_{GSN}=0.25V$, a supply voltage of 2V and a reference voltage Vref and a control signal Vcmp of 1V, FIG. 7 is showing the resulting voltages in the circuit, wherein $V_{GSP}$ stands for a gate source voltage of pMOS transistors and $V_{GSN}$ stands for a gate source voltage of nMOS transistors in the bias current source 1. It can be seen that all pMOS devices 17, 18 and 10 operate at the same drain-source voltage (−1.5V). Also, all nMOS devices 26, 27 and 9 are operating at the same drain-source voltage (0.5V).

A similar approach can be followed if it is considered that the sensing of the bias current Ib is done with a diode-connected transistor placed between the nMOS transistors 31 drain and the ground. To compensate the fact that the nMOS transistor 31 will work at a drain-source voltage diminished by $V_{GSN}$ compared to FIG. 7, a diode-connected nMOS device should be connected for example between the source of fifth transistor 35 and the ground node 20 and respectively between the source of the sixth transistor 36 and the ground node 20.

For the numerical example shown in FIG. 7, the first transistor 17, the second transistor 18 and the pMOS transistor 31 will work at a drain-source voltage of −1.25V. The third transistor 26, the fourth transistor 27 and the nMOS transistor 23 will work at a drain-source voltage of 0.5V.

Figure 10:
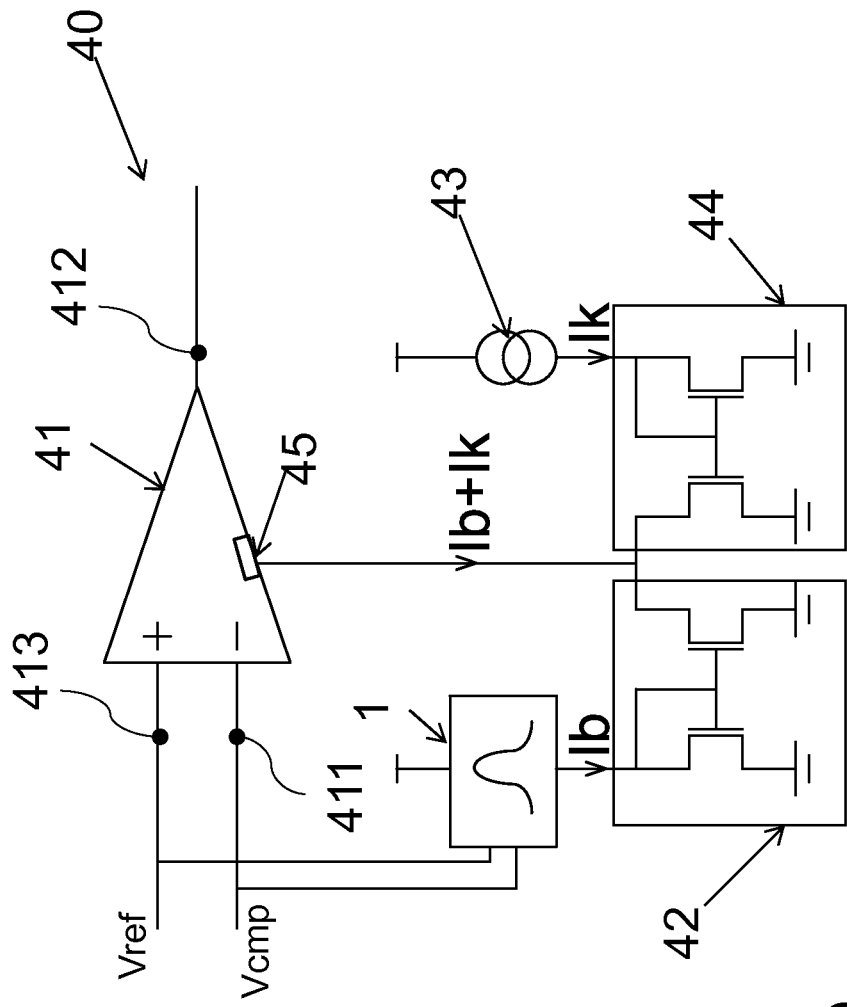
FIG. 10 schematically shows a circuit diagram of an example of an integrated circuit.

FIG. 10 schematically shows an example of an integrated circuit 40, such as an analog or mixed signal integrated circuit. The integrated circuit 40 comprises a threshold detector 41. Although not shown, in FIG. 10, it will be apparent that the integrated circuit 40 may comprise other electronic circuitry, for example, connected to the output of threshold detector, interacting with the threshold detector. For example, the integrated circuit can include a microcontroller, general purpose microprocessor, a digital signal processor or other suitable logic circuitry and threshold detector 41 be used as a power on reset thereof. Likewise, the integrated circuit can include, for example, an internal or external bus driver or transceiver and the threshold detector 41 can be used to process differential bus signals of the respective bus.

In the example of FIG. 10, the electronic circuit is a comparator, such as a current comparator or voltage comparator, but may likewise be another electronic circuit which compares two input values, such as voltages, currents or digital values, and outputs a signal indicating which of the input values is larger. As shown, the threshold detector comprises a detector input 411 for receiving an input signal, in the form of a voltage signal Vcmp and an output 412 for outputting a signal indicating whether or not a value of a predetermined parameter of the input signal exceeds a threshold value. In this example, the threshold value is presented at a second input 413 in the form of a reference voltage Vref.

The threshold detector 41 further comprises a bias input to which a bias current source 1, e.g., such as in the examples described above is connected, in this example via an arrangement of respective current mirrors 42, 44. In this example, the bias current source 1 has bias current characteristics as in FIG. 9 and may for example be implemented as in the example of FIG. 4 or 7, but it will be apparent that depending on the specific implementation a bias current source with other suitable characteristics, such as in FIG. 5 or 6 may be used.

In the example of FIG. 10, the reference voltage Vref and the control voltage Vcmp are both provided to the bias current source 1 and the bias current source provides a maximum bias current when the reference voltage Vref equals the control voltage Vcmp (or said differently the difference, Δ, is zero). Thus, the bias current source 1 control signals are the same as for the threshold detector 41 whose performance in speed and precision requires the "higher" current when the reference voltage Vref and the control voltage Vcmp are similar. Accordingly, operation of the bias current source 1 and the threshold detector are inherently synchronized. However, it will be apparent the control signal of the bias current source 1 could be different from the signals of the threshold detector 41 itself. In another embodiment, the bias current source 1 uses the same input signals as the threshold detector 41.

As shown, the bias current source 1 is connected to a control path of a bias current mirror 42. The mirror path of the bias current mirror connects the bias input 45 to a low power node, e.g., ground. The bias current Ib provided by the bias current source 1 is provided to the control path of the third current mirror 42, which generates a copy of the bias current Ib according to the bias current mirror characteristics thereof of the threshold detector 41 and provides the copied bias current Ib to the bias input 45 or more precisely controls the current flowing from the bias current input 45 to ground to be a copy of the bias current Ib. It will be apparent that the copied bias current Ib may be a one-to-one copy or be scaled (e.g., to be a factor k smaller or larger than the bias current Ib, in which case the threshold detector is biased with an actual current MD).

In the shown example, the bias input 45 is further connected, in this example via another current mirror, to a state retention current source 43, in this example constant current source. The state retention current source 43 provides a state retention current Ik sufficient to maintain the state of the threshold detector. It will be apparent that a state retention current Ik can be provided in any other suitable manner. For example, the bias current source 1 can be configured to provide the minimum current Ik when the reference voltage Vref and the control voltage Vcmp are far apart from each other and accordingly the state retention current source 43 and the state retention current mirror 44 be omitted, e.g., as explained below with reference to FIG. 11.

The bias input 45 receives both the state retention current Ik and the bias current Ib from the current source. Thus, in case the bias current source 1 provides no bias current, such as in this example when the reference voltage Vref and the control voltage Vcmp are far apart from each other, the state of the threshold detector can be retained because the current source 43 allows to provide, via the current mirror 44 in this example, a minimum current Ik which allows the comparator to keep its state when the bias current source 1 provides no current.

As mentioned, the circuit comprises a state retention current mirror 44 connected to the bias input and the state retention current source. The state retention current mirror 44 provides to the bias input a current which is a copy of the state retention current Ik or more precisely controls the current flowing from the bias current input 45 to ground to be a copy of the state retention current Ik. It will be apparent that the copied the state retention current Ik may be a one-to-one copy or be scaled (e.g., to be a factor k smaller or larger than the state retention current Ik, in which case the threshold detector is biased with an actual current k*Ik).

Stated otherwise, in the example of FIG. 10, the bias current source 1 is connected to a current mirror arrangement of current mirrors 42,44 connected in parallel between the bias input 45 and ground. The bias current source is connected to the control path of a respective current source whereas the control path of the other current mirror is connected to a constant current source 43.

It will be apparent that although only a single threshold detector 41 and bias current source 1 are shown, the integrated circuit may comprise multiple detectors which may share the same bias current source or have different bias current source. For example, a bias current source 1 could be used in a bus transceiver of the integrated circuit 40 and another bias current source 1 could be used to provide a current to a power on reset of a microcontroller of the integrated circuit 40.

Figure 11:
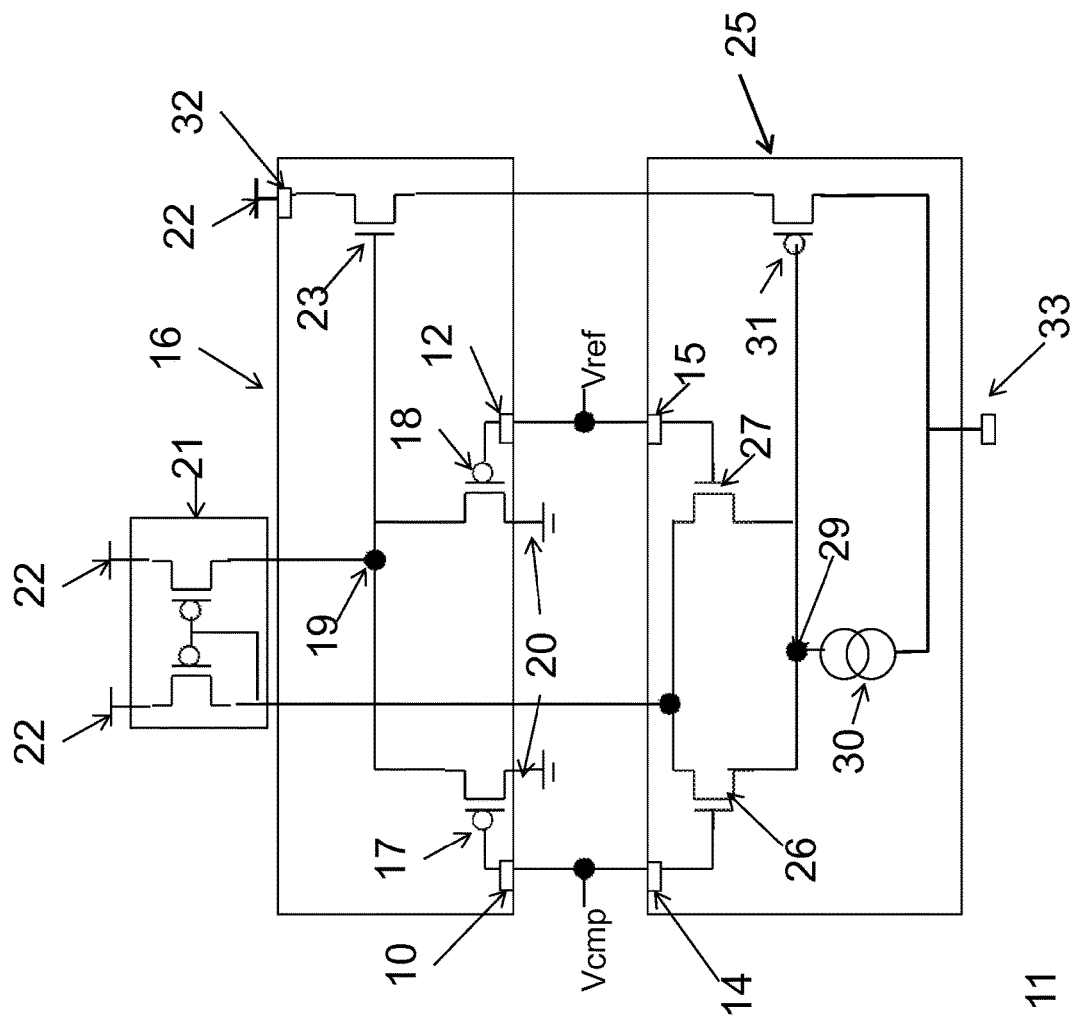
FIG. 11 schematically shows a circuit diagram of an example of a bias current source.

FIG. 11 schematically shows an example of another bias current source 1. The embodiment of the bias current source 1 of FIG. 11 is similar to the bias current source of FIG. 4. However, in contrast to FIG. 4, in FIG. 11, the first current source 21 is not a constant current source but implemented as a current mirror which copies the sum of the drain currents of transistors 26 and 27, which equals the current provided by the second current source 30 and provides this copied current to the node 19 to flow through the transistors 17 and 18. In this example, a control path of the first current mirror 21 is connected between the positive supply node 22 and the common node between the power inputs of transistors 26 and 27, and the transistors 26 and 27 are not connected to the positive supply voltage 28. An output of the current mirror 21 is connected to the first node 19.

In an embodiment, the current Ik flowing from the positive supply node 22 to ground through the path provided by the first current mirror and the second current source through the second voltage follower 29 can be added to the bias current Ib. For example, that path may be connected in parallel to the bias current path. As a result, the bias current provided by the bias current circuit would be Ib+Ik, where Ib varies between 0 to a maximum as a function of the difference ΔK*Ik and back to 0 when Vcmp increases.

Figure 12:
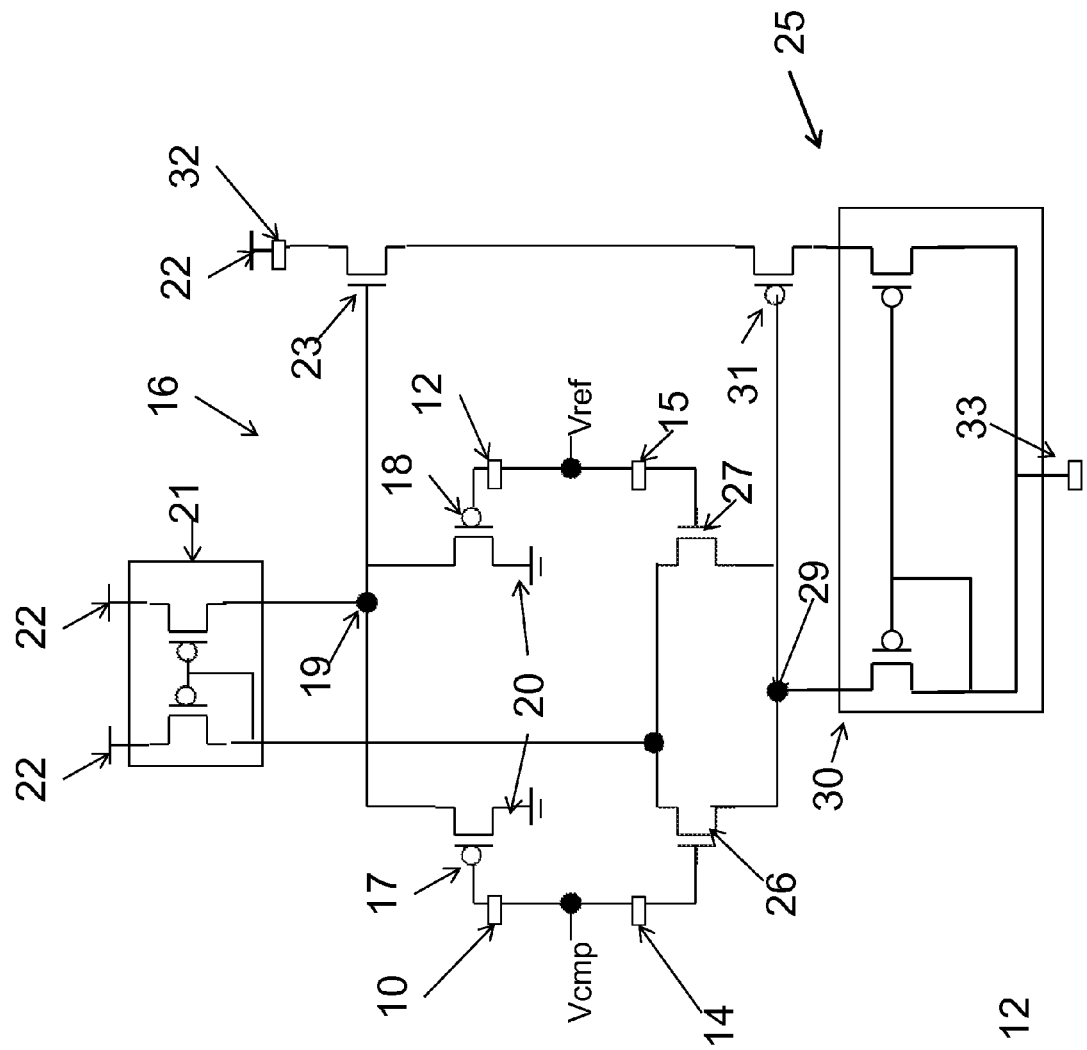
FIG. 12 schematically shows a circuit diagram of an example of a current source.

Additionally, the second current source 30 may be implemented as a current mirror of which the control path is connected between the fourth node 29 and ground, whereas the mirror path is part of the bias current path, and for example between second bias current control element 31 and ground, as shown in FIG. 12. In such a case, the first and second current source 21,30 can be designed so as to provide a constant current Ik, which added to the copied current flowing through the bias current path, is sufficient for the comparator to keep its state In the foregoing specification, the invention has been described with reference to specific examples of embodiments of the invention. It will, however, be evident that various modifications and changes may be made therein without departing from the broader scope of the invention as set forth in the appended claims, and that the drawings are illustrative and not intended to be restrictive.

For instance, skilled artisans will appreciate that elements in the FIGS. are illustrated for simplicity and clarity and have not necessarily been drawn to scale. For example, the chosen elements are only used to help to improve the understanding of the functionality and the arrangements of these elements in various embodiments of the present invention. Also, common but well understood elements that are useful or necessary in a commercial feasible embodiment are mostly not depicted in order to facilitate a less abstracted view of these various embodiments of the present invention.

Furthermore, instead of bias current control elements in series as in FIGS. 4 and 7, the bias current control elements 23,31 can be arranged electrically in parallel. This would result in the sum of the currents flowing there through being provided by the bias current source 1 and in case of different threshold values for both bias current control elements allow a bias current can be, which has a defined maximum at Vref=Vcmp. This could be achieved for example by moving in FIG. 8 the line which represents the current of the first bias current control element 23 to the right, e.g., by adapting the respective saturation threshold of the transistor or the ration of the respective reference voltage Vref or the respective control voltage Vcmp.

Likewise the transistors can be any type of transistors, such as MOS, bipolar or otherwise, suitable for the specific implementation. In conjunction with transistors, a current terminal can be a collector, a drain, emitter, a source or the like, and a control input can be a base, a gate connection or the like.

Although the invention has been described with respect to specific conductivity types or polarity of potentials, skilled artisans appreciated that conductivity types and polarities of potentials may be reversed. Likewise, it will be apparent that the connections between elements of the invention may be any type of connection suitable to transfer signals from or to the respective nodes, circuit elements or devices, for example via intermediate devices. Accordingly, unless implied or stated otherwise the connections may for example be direct connections or indirect connections.

Thus, it is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of circuits or intermediary components. Likewise, any two components so associated can also be viewed as being "operably connected," or "operably coupled," to each other to achieve the desired functionality.

Moreover, the terms "upper," "lower," "high," "low," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Also for example, in an embodiment, the illustrated elements of the bias current source 1 or the integrated circuit 40 are circuitry located on a single integrated circuit or within the same device. Alternatively, bias current source 1 or integrated circuit 40 may include any number of separate integrated circuits or separate devices interconnected with each other.

However, other modifications, variations and alternatives are also possible. The specifications and drawings are, accordingly, to be regarded in an illustrative rather than in a restrictive sense.

The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A bias current source, comprising:
   a bias current path between a high power supply node and a low power supply node, for providing a bias current flowing from the high power supply node to the low power supply node;
   a first control input for receiving a control signal; and
   a bias current control circuit in the bias current path and connected to the first control input, the bias current control circuit controlling, when the bias current source is in operation, the bias current as a function of the difference between a control value of a predetermined parameter of the control signal and a reference value,
   said bias current decreasing in at least one of ranges (a) or (b) when the absolute value of the difference increases, range (a) being the range in which the difference is positive and range (b) being the range in which the difference is negative;
   the bias current control circuit comprises a first bias current control element and a second bias current control element in the bias current path, each having a controllable device and a voltage follower, the voltage follower comprising:
   a current source;
   a first transistor connected with a first current terminal to the current source and to a control input of the controllable device, with a second current terminal to a respective one of the high power supply node and the low power supply node and with a control input to the control voltage control input; and
   a second transistor connected with a first current terminal to the current source and to the control input of the controllable device, with a second current terminal to a respective one of the high power supply node and the low power supply node and with a control input to the reference voltage input;
   the first and second transistors in the voltage follower of the first bias control element are of a first conductivity type, and first and second transistors in the voltage follower of the second bias control element are of a second conductivity type opposite to the first conductivity type;
   the controllable device of the first bias current control element comprises a transistor of the second conductivity type; and
   the controllable device of the second bias current control element comprises a transistor of the first conductivity type.

2. A bias current source as claimed in claim 1, wherein, when the bias current source is in operation, the bias current is monotonically decreasing when the absolute value of the difference increases in one of (a) or (b) and constant as a function of the difference when said absolute value exceeds a predetermined saturation value in the other one of (a) and (b).

3. A bias current source as claimed in claim 1, wherein in both ranges (a) and (b), said bias current is constant when said absolute value exceeds a predetermined saturation value, is monotonically decreasing as a function of the difference when said absolute value is between the saturation value and zero, and the bias current has a maximum when said absolute value is negligible.

4. A bias current source as claimed in claim 2, wherein the constant bias current is larger than zero.

5. The bias current source of claim 1, comprising a second control input for receiving the reference value.

6. The bias current source as claimed in claim 5, wherein the first control input is a control current input for receiving a control current and the second control input is a reference current input for receiving a reference current, and the bias current control circuit controls, when the bias current source is in operation, the bias current as a function of the difference between the control current and the reference current, said function decreasing when the absolute value of said difference increases.

7. The bias current source as claimed in claim 5, wherein the first control input is a control voltage input for receiving a control voltage and the second control input is a reference voltage input for receiving a reference voltage, and the bias current control circuit controls, when the bias current source is in operation, the bias current as a function of the difference between the control voltage and the reference voltage, said function decreasing when the absolute value of said difference increases.

8. A bias current source as claimed in claim 1, wherein the first bias current control element and the second bias current control element each have a variable impedance;
the first bias current control element presenting a first variable impedance in the bias current path which varies, when the bias current source is in operation, as a monotonic increasing function of said control value if said difference is smaller than zero; and
the second bias current control element presenting a second variable impedance in the bias current path which varies, when the bias current source is in operation, as a monotonic decreasing function of said control value if said difference is larger than zero.

9. A bias current source as claimed in claim 8, wherein the first bias current control element and the second bias element are connected in series.

10. The bias current source as claimed in claim 8, wherein the controllable device of the first bias current control element and the controllable device of the second bias current control element each comprise a first current terminal and a second current terminal, and a control terminal for controlling current flowing between the first current terminal and the second current terminal, and the bias current control circuit comprises at least one of a first control circuit and a second control circuit, the first bias control element connected to the control terminal of the controllable device of the first bias current control element and a second bias control element connected to the control terminal of the controllable device of the second bias current control element.

11. The bias current source as claimed in claim 1, wherein the current source in the voltage follower of at least one of the first bias control element and the second bias control element comprises a current mirror which provides, when the bias current source is in operation, to the first transistor a current and the first transistor of the other one of the first bias control element and the second bias control element a copied current which is a copy of the current to the first transistor.

12. A threshold detector, comprising:
a detector input for receiving an input signal;
an output for outputting a signal indicating whether or not a value of a predetermined parameter of the input signal exceeds a threshold value;
a bias input;
a bias current source connected with a first control input to the detector input, and with at least one of the high power supply node and a low power supply node to the bias input, the bias current source comprising:
a bias current path between the high power supply node and the low power supply node, the bias current path to provide a bias current flowing from the high power supply node to the low power supply node;
a first control input to receive a control signal; and
a bias current control circuit in the bias current path and connected to the first control input, the bias current control circuit to control, when the bias current source is in operation, the bias current as a function of the difference between a control value of a predetermined parameter of the control signal and a reference value,
said bias current monotonically decreasing from a maximum value to a minimum value when the absolute value of the difference increases and during at least one of: when the difference is positive; and when the difference is negative, wherein the bias current is at the maximum value when the control value equals the reference value, and is at the minimum value when the absolute value of the difference is at a threshold value;
the bias current control circuit comprises a first bias current control element and a second bias current control element in the bias current path, each having a controllable device and a voltage follower, the voltage follower comprising:
a current source;
a first transistor connected with a first current terminal to the current source and to a control input of the controllable device, with a second current terminal to a respective one of the high power supply node and the low power supply node and with a control input to the control voltage control input; and
a second transistor connected with a first current terminal to the current source and to the control input of the controllable device, with a second current terminal to a respective one of the high power supply node and the low power supply node and with a control input to the reference voltage input;
the first and second transistors in the voltage follower of the first bias control element are of a first conductivity type, and first and second transistors in the voltage follower of the second bias control element are of a second conductivity type opposite to the first conductivity type;
the controllable device of the first bias current control element comprises a transistor of the second conductivity type; and
the controllable device of the second bias current control element comprises a transistor of the first conductivity type.

13. The threshold detector as claimed in claim 12, comprising a bias current mirror connected between the bias current source and the bias input, for providing to the bias input a current which comprises a copy of the bias current provided by the bias current source.

14. The threshold detector as claimed in claim 12, comprising a state retention current source connected to the bias input, for providing a state retention current sufficient to maintain the state of the threshold detector, the bias input receiving both the state retention current and the bias current from the current source.

15. The threshold detector as claimed in claim 14, comprising a state retention current mirror connected to the bias input and the state retention current source, for providing to the bias input a current which is a copy of the state retention current.

16. An integrated circuit, comprising at least one of a bias current source as claimed in claim 1 and an electronic circuit comprising a bias input connected to the bias current source.

17. A method comprising:
providing, via a bias current path between a high power supply node and a low power supply node, a bias current flowing from the high power supply node to the low power supply node;
receiving, at a first control input, a control signal; and
controlling, by a bias current control circuit, when a bias current source is in operation, the bias current as a function of a difference between a control value of a predetermined parameter of the control signal and a reference value, wherein the bias current monotonically decreases from a maximum value to a minimum value when the absolute value of the difference increases and during at least one of: when the difference is positive; and when the difference is negative, wherein the bias current is at the maximum value when the control value equals the reference value, and is at the minimum value when the absolute value of the difference is at a threshold value, wherein
the bias current control circuit comprises a first bias current control element and a second bias current control element in the bias current path, each having a controllable device and a voltage follower, the voltage follower
comprising
a current source;
a first transistor connected with a first current terminal to the current source and to a control input of the controllable device, with a second current terminal to a respective one of the high power supply node and the low power supply node and with a control input to the control voltage control input; and
a second transistor connected with a first current terminal to the current source and to the control input of the controllable device, with a second current terminal to a respective one of the high power supply node and the low power supply node and with a control input to the reference voltage input;
the first and second transistors in the voltage follower of the first bias control element are of a first conductivity type, and first and second transistors in the voltage follower of the second bias control element are of a second conductivity type opposite to the first conductivity type;
the controllable device of the first bias current control element comprises a transistor of the second conductivity type, and
the controllable device of the second bias current control element comprises a transistor of the first conductivity type.

18. The threshold detector of claim 12, wherein the constant bias current is larger than zero.

19. The threshold detector of claim 12, comprising a second control input for receiving the reference value.

* * * * *